US007799414B2

(12) United States Patent
Yamada et al.

(10) Patent No.: US 7,799,414 B2
(45) Date of Patent: Sep. 21, 2010

(54) LAMINATED STRUCTURE, DONOR SUBSTRATE, AND METHOD FOR FABRICATING LAMINATED STRUCTURE (75) Inventors: Takayuki Yamada, Kanagawa (JP); Kazuaki Tabata, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 1281 days.

(21) Appl. No.: 11/314,359

(22) Filed: Dec. 22, 2005

(65) Prior Publication Data
US 2006/0280961 A1 Dec. 14, 2006

(30) Foreign Application Priority Data
Jun. 9, 2005 (JP) ............................... 2005-169529

(51) Int. Cl.
*B32B 9/00* (2006.01)
(52) U.S. Cl. .................... 428/217; 428/469; 428/697
(58) Field of Classification Search ........................ None
See application file for complete search history.

(56) References Cited

U.S. PATENT DOCUMENTS

| 1,665,000 | A | * | 4/1928 | Trist .............................. 101/458 |
| 3,465,419 | A | * | 9/1969 | Lilja et al. ..................... 228/160 |
| 4,139,933 | A | * | 2/1979 | Ballard et al. .................. 29/412 |
| 5,380,407 | A | * | 1/1995 | Yamaoka et al. ............. 205/122 |

FOREIGN PATENT DOCUMENTS

| JP | A-11-172412 | 6/1999 |
| JP | A-2003-181976 | 7/2003 |
| JP | A 2004-358602 | 12/2004 |

OTHER PUBLICATIONS

Office Action issued in Japanese Patent Application No. 2005-169529 on Jun. 15, 2010 (with English-Language Translation).

* cited by examiner

*Primary Examiner*—Timothy M Speer
(74) *Attorney, Agent, or Firm*—Oliff & Berridge, PLC (57) ABSTRACT A laminated structure includes: a plurality of first electroconductive films each having a prescribed hardness; and a plurality of second electroconductive films each having a hardness that is lower than the prescribed hardness. The first and second electroconductive films are laminated alternately.

11 Claims, 5 Drawing Sheets

LAMINATED STRUCTURE, DONOR SUBSTRATE, AND METHOD FOR FABRICATING LAMINATED STRUCTURE

BACKGROUND OF THE INVENTION

1. Field of the Invention

The present invention relates to a laminated structure, a donor substrate and a fabrication method for a laminated structure, such as a micro optical part, a micro mechanical part and a micro fluidic device, and a metallic mold for forming them, obtained by laminating patterns formed by electroforming.

2. Description of the Related Art

A lamination modeling method is being rapidly spread in recent years as a method of forming a three-dimensional part having a complex shape designed with a computer in a short delivery period. A three-dimensional part fabricated by the lamination modeling method is utilized as a model of a part (prototype) of various equipments for investigating quality of performance and shape of the part. The size of the part, to which the method is applied, has been relatively large as being several centimeters or larger, but there is such a demand that the method is applied to production of a micro structure, such as a micro optical part and a micro mechanical part, formed through high-precision processing.

As a fabrication process of a microstructure, for example, the following process has been known. A low-adhesion layer of polyimide or a thermal oxide film and an conductive layer are formed sequentially on a Si wafer substrate, and a resist pattern layer with a reversal pattern of a cross sectional pattern is formed on the conductive layer. A cross sectional pattern part is formed by plating in the space of the resist pattern layer, and the resist pattern layer is removed to fabricate a donor substrate. A target substrate is disposed to face the donor substrate, and such an operation is repeated that the target substrate aligned to the cross sectional pattern part is contacted thereto under pressure and then released therefrom, whereby the cross sectional pattern part is transferred and laminated onto the target substrate to construct a laminated structure (See, for example, JP-A-2004-358602 ([0027] - [0035], FIGS. 1 to 6.)

According to the conventional process for producing a laminated structure, however, the donor substrate is produced by the electroforming method, which brings about a problem inherent to the electroforming method, i.e., a poor thickness profile is obtained. The poor thickness profile appears as such a phenomenon as a slanted electroformed surface, an increased thickness of the film near the resist, a dome-like electroformed surface, and fluctuation in thickness of the film caused by fluctuation in density of distances in the resist pattern. Accordingly, it is difficult to fabricate a laminated structure with good accuracy and good yield.

An object of the invention is to provide such a laminated structure, a donor substrate and a process for producing a laminated structure that a laminated structure can be fabricated with good accuracy and good yield even in the case where fluctuation occurs in thickness of the electroconductive film formed by electroforming.

SUMMARY OF THE INVENTION

The invention may provide a laminated structure, including: a plurality of first electroconductive films each having a prescribed hardness; and a plurality of second electroconductive films each having a hardness that is lower than the prescribed hardness; wherein the first and second electroconductive films are laminated alternately.

The invention may provide a donor substrate including: a substrate; a plurality of first electroconductive films each having a prescribed hardness, formed on the substrate; and a plurality of second electroconductive films each having a hardness that is lower than the prescribed hardness; wherein the plurality of second electroconductive films are formed on the plurality of first electroconductive films respectively.

The invention may provide a method for fabricating a laminated structure including: preparing a first substrate having electroconductivity, forming a first electroconductive film having a prescribed hardness on the first substrate by an electroforming; forming a second electroconductive film having a hardness that is lower than the prescribed hardness on the first electroconductive film by an electroforming; patterning the first electroconductive film and the second electroconductive film to a prescribed pattern to form a plurality of electroconductive film patterns; and subjecting the first substrate and a second substrate repeatedly to pressure contact and release to transfer sequentially the plurality of electroconductive film patterns on the first substrate onto the second substrate.

BRIEF DESCRIPTION OF THE DRAWINGS

Embodiment may be described in detail with reference to the accompanying drawings, in which.

DETAILED DESCRIPTION OF THE INVENTION

First Embodiment

A production process of an electroformed laminated structure according to a first embodiment of the invention will be described with reference separately to production of a donor substrate and transfer of an electroconductive film pattern.

(1) Production of Donor Substrate

FIGS. 1A to 1F show a production process of a donor substrate according to a first embodiment. A metallic substrate 1 is prepared as a first substrate containing an iron series metal, such as stainless steel, or a nonferrous metal, such as copper. The metallic substrate 1 has a thickness of from 0.1 to 5 mm, and preferably from 0.5 to 1 mm.

Figure 1A:
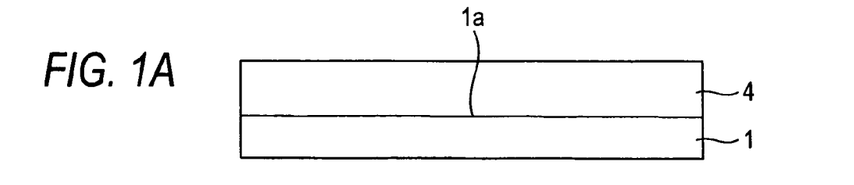
FIGS. 1A to 1F are cross sectional views showing a production process of a donor substrate according to a first embodiment.

The surface 1a of the metallic substrate 1 is mirror-polished. The polishing operation is carried out by plural steps of from rough polishing to finish polishing by using electrolytic polishing and mechanical polishing with free abrasive grains. The surface roughness (arithmetic average roughness Ra) is finally decreased to 10 nm or less, and preferably 5 nm or less since a smaller surface roughness decreases the adhesion force after forming a pattern, which improves the yield on bonding and transferring in the later step. A too small surface roughness may bring about unexpected release of the film upon growing the film by electroforming, rinsing after growing, and removing the resist. Therefore, the surface roughness is preferably about from 3 to 5 nm.

The surface roughness may be measured by using an atomic force microscope (AEM), a white light interferometer or a stylus surface profiler.

As shown in FIG. 1A, a thick resist is coated on the surface 1a of the metallic substrate 1 to a thickness, for example, of 30 μm to form a resist film 4.

Figure 1B:
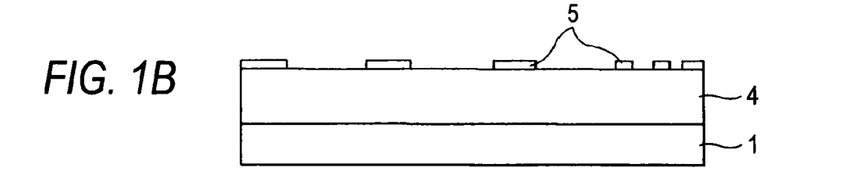
Figure 1C:
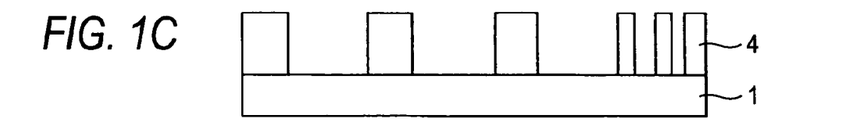

As shown in FIG. 1B, a photomask 5 having a prescribed pattern is provided on the resist film 4. As shown in FIG. 1C, the resist film 4 is exposed through openings of the photo mask 5 with an exposing means, which is not shown in the figures. According to the operation, a resist pattern having a reversal pattern of a cross sectional pattern of a target structure is formed.

Figure 1D:
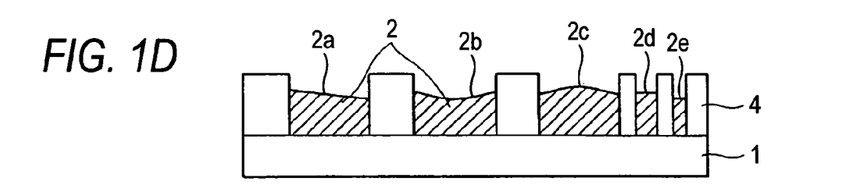

The metallic substrate 1 in the state shown in FIG. 1C is immersed in a plating bath, whereby a first electroplated film 2 of nickel as the first electroconductive film is grown to a thickness, for example, of 25 μm as shown in FIG. 1D. At this time, the thickness of the electroplated film 2 is fluctuated in some cases from about 24 to 26 μm depending on the location and shape of the cross sectional pattern. For example, as shown in FIG. 1D, such surfaces appear as an electroplated surface 2a being slanted, an electroplated surface 2b having a recession by increasing the thickness near the resist film 4, an electroplated surface 2c having a domy shape, and electroplated surfaces 2d and 2e having fluctuation in thickness caused by the local density of the resist film 4. A nickel alloy, copper and a copper alloy may also be used as the first electroplated film 2 instead of nickel.

Figure 1E:
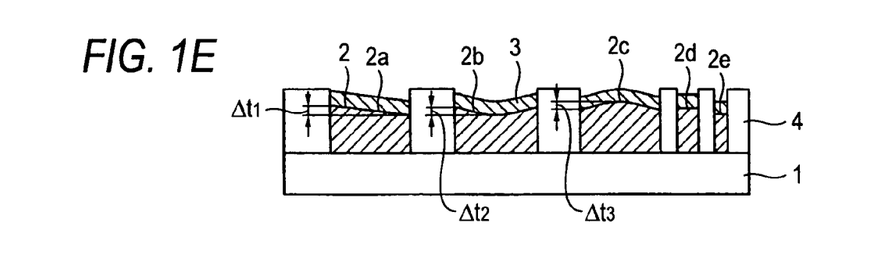

As shown in FIG. 1E, a second electroconductive film 3 of a soft material, such as gold, as the second electroconductive film is grown, for example, by electroplating in another plating bath or by a vacuum deposition method, such as sputtering and resistance heating vapor deposition. The second electroconductive film 3 has a lower hardness and a smaller thickness than the first electroconductive film 2. In the case where the second electroconductive film 3 is formed by plating, it is formed to have a height that does not exceed the height of the resist film 4. In the case where the second electroformed film 3 is formed by a vacuum deposition method, the second electroconductive film 3 may be formed not only on the surface of the first electroplated film 2 but also on the surface of the resist film 4. The second electroconductive film 3 on the resist film 4 is removed along with the resist film 4 upon removing the resist film 4 and thus does not remain on the metallic substrate 1.

The thickness of the second electroformed film 3 is determined in consideration of the thickness distribution of the first electroplated film 2. That is, the thickness of the second electroconductive film 3 is made larger than the differences $\Delta t_1$, $\Delta t_2$ and $\Delta t_3$ between the maximum values and the minimum values of the thickness of the first electroplated film 2. For example, in the case where $\Delta t_1$ is the largest among $\Delta t_1$, $\Delta t_2$ and $\Delta t_3$, the thickness of the second electroconductive film 3 is made larger than $\Delta t_1$. In this embodiment, the second electrodonductive film 3 is formed to have a thickness of 2 μm.

Figure 1F:
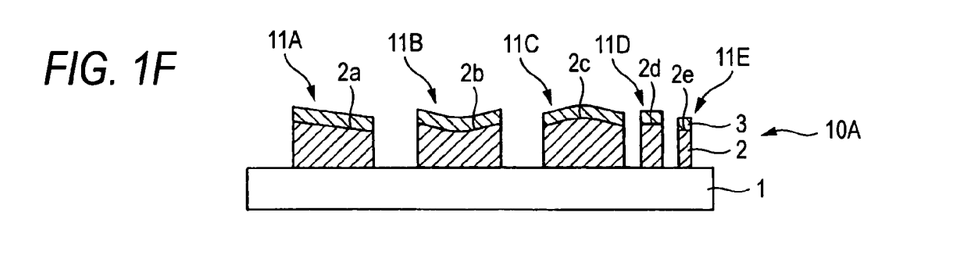

The resist film 4 is then removed to complete a donor substrate 10A having plural electroconductive film patterns 11A-to 11E each containing the first electroplated film 2 and the second electroconductive film 3 as shown in FIG. 1F.

(2) Transfer of Electroconductive Film Pattern

FIGS. 2A to 2F show a transferring step of the electroconductive film pattern. The electroformed laminated structure is fabricated by transferring and laminating sequentially the five electroconductive film patterns 11A to 11E on the donor substrate 10A fabricated by the process shown in FIGS. 1A to 1F onto a surface of a target substrate 20 as the second substrate.

Figure 2A:
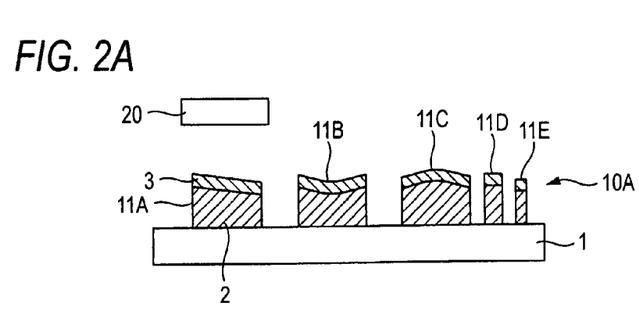
FIGS. 2A to 2F are cross sectional views showing a laminating step of an electroconductive film pattern according to the first embodiment.

In a vacuum chamber, which is not shown in the figures, containing an upper stage and a lower stage, which are not shown in the figures, the target substrate 20 is placed on the upper stage, and the donor substrate 10A is placed on the lower stage. The vacuum chamber is evacuated to make a high vacuum state or a super-high vacuum state.

Figure 2B:
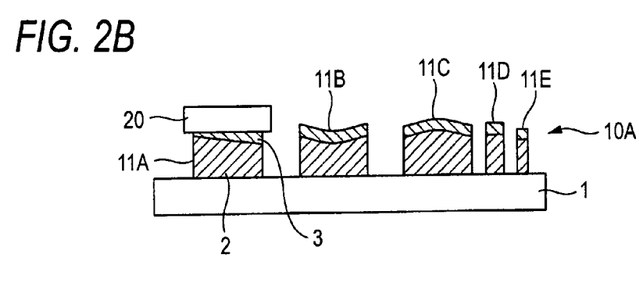

Then, the surfaces of the donor substrate 10A and the target substrate 20 are cleaned by irradiation of FAB (fast atom beam). Then, the lower stage and the upper stage are relatively moved to the position where the target substrate 20 is located just above the first electroconductive film pattern 11A on the donor substrate 10A as shown in FIG. 2A. The upper stage is then brought down to make the lower surface of the target substrate 20 in contact with the upper surface of the electroconductive film pattern 11A as shown in FIG. 2B. At this time, the upper stage is applied with a prescribed downward load for a prescribed period of time.

The load applied to the upper stage (pressure contact stress) is equal to or larger than the yield stress of the second electroformed film 3 and is equal to or less than a yield stress of the first electroformed film 2. According to the operation, even in the case where the upper surface of the first electroformed film 2 is not flat, the soft second electroformed film 3 is pressed, whereby the surface of the second electroformed film 3 is in parallel to the metallic substrate 1 and is bonded to the lower surface of the target substrate 20 at ordinary temperature.

Figure 2C:
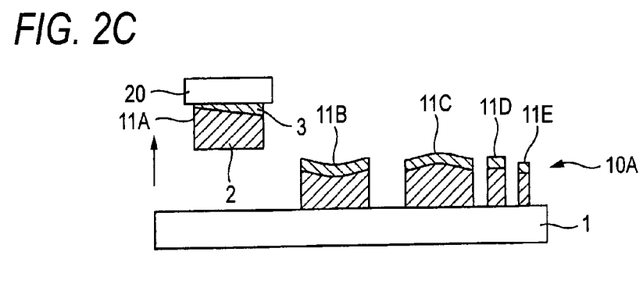
Figure 2D:
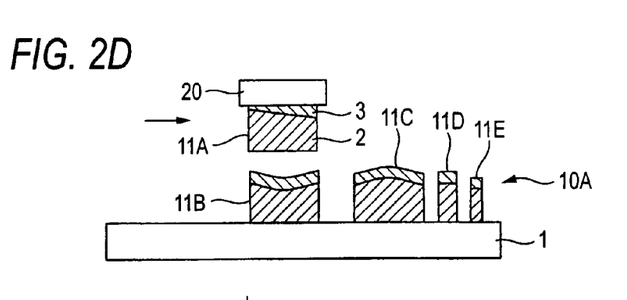

The upper stage is then brought up, whereby the electroconductive film pattern 11A of the first layer is released from the metallic substrate 1 and transferred onto the target substrate 20 as shown in FIG. 2C. At this time, the surface 1a of the metallic substrate 1 is mirror-polished, and thus the electroconductive film pattern 11A can be easily released from the metallic substrate 1.

Figures 2E, 2F:
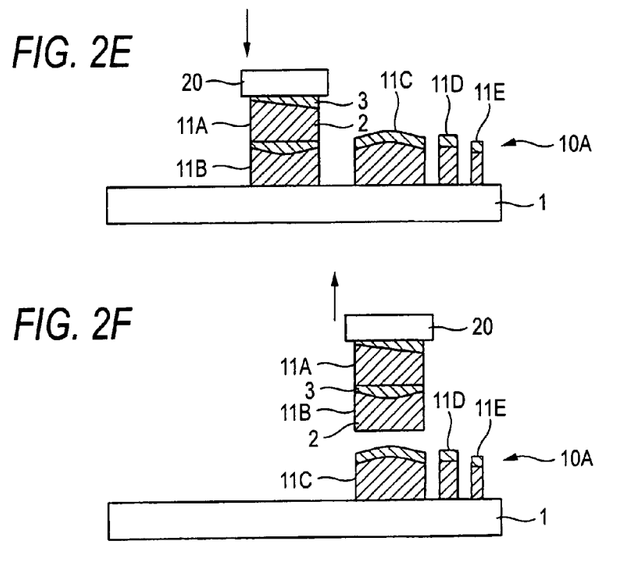

The upper stage is then relatively moved to the position above the electroconductive film pattern 11B of the second layer to make the electroconductive film pattern 11A on the target substrate 20 face the electroconductive film pattern 11B as shown in FIG. 2B. The upper stage is then brought down to make the electroconductive film pattern 11A in contact with the electroconductive film pattern 11B as shown in FIG. 2E. At this time, the electroconductive film pattern 11B is applied with a prescribed downward load for a prescribed period of time as similar to the step shown in FIG. 2B.

The upper stage is then brought up, whereby the electroconductive film pattern 11B of the second layer is released from the metallic substrate 1 and transferred onto the lower surface of the electroconductive film pattern 11A, and thus the electroconductive film pattern 11A of the first layer and the electroconductive film pattern 11B of the second layer are laminated, as shown in FIG. 2F. Subsequently, the electroconductive film patterns 11C to 11E of the third to fifth layers are transferred and laminated onto the electroconductive film pattern 11B in the similar manner to form an electroformed laminated structure on the target substrate 20.

Figure 3:
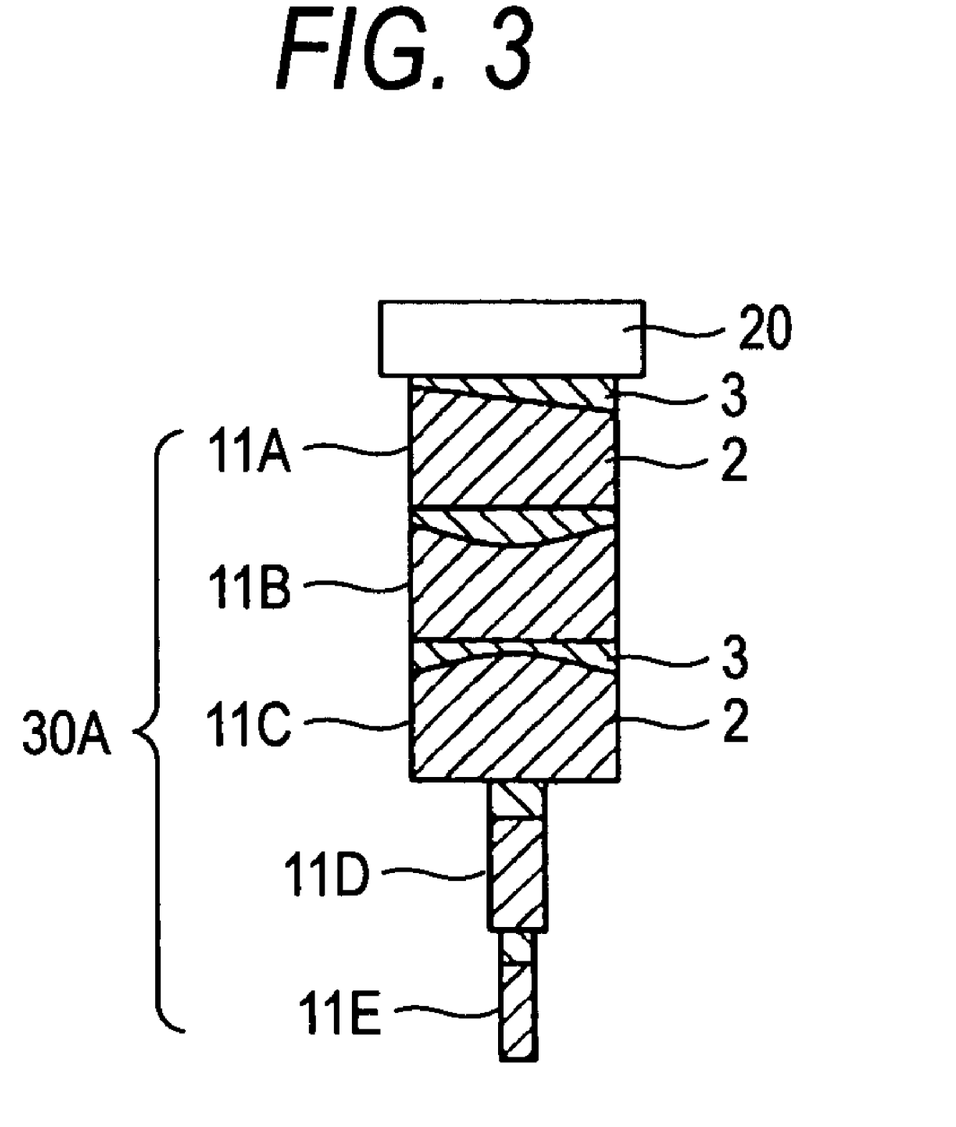
FIG. 3 is a cross sectional view of the electroformed laminated structure according to the first embodiment.

FIG. 3 is a cross sectional view of the electroformed laminated structure formed on the target substrate 20. Thereafter, the electroformed laminated structure 30A thus transferred onto the target substrate 20 is removed from the upper stage, and the target substrate 20 is removed therefrom to obtain the electroformed laminated structure 30A.

Advantage of First Embodiment

The first embodiment exerts the following advantages.

(a) The electroconductive film pattern 11 has a two-layer structure containing the first electroformed film 2 of nickel having a high hardness, which mainly forms the structure, and the second electroformed film 3 of gold having a hardness lower than the first electroformed film 2, whereby a laminated structure can be fabricated with good accuracy and good yield even in the case where the first electroformed film 2 is fluctuated in thickness.

(b) The pressure contact stress occurring in the electroconductive film pattern 11 by the upper stage and the lower stage upon transferring is equal to or larger than the yield stress of the second electroformed film 3 and is equal to or less than a yield stress of the first electroformed film 2, whereby the thickness of the electroconductive film pattern 11 is uniformized to obtain an electroformed laminated structure with high accuracy.

(c) The metallic substrate 1 has a surface roughness of 10 nm or less in terms of Ra, whereby the electroconductive film pattern 11 can be easily released from the metallic substrate and transferred to the target substrate 20.

Second Embodiment

A production process of an electroformed laminated structure according to a second embodiment of the invention will be described with reference separately to production of a donor substrate and transfer of an electroconductive film pattern.

(1) Production of Donor Substrate

Figure 4A:
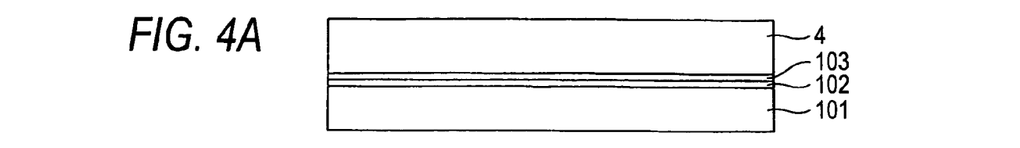
FIGS. 4A to 4F are cross sectional views showing a production process of a donor substrate according to a second embodiment.

FIGS. 4A to 4F show a production process of a donor substrate according to a first embodiment. As shown in FIG. 4A, a releasing layer 102 is formed on a Si wafer substrate 101, an electroconductive layer 103 is formed thereon, and a thick resist is coated thereon to a thickness, for example, of 30 μm to form a resist film 4.

Figure 4B:
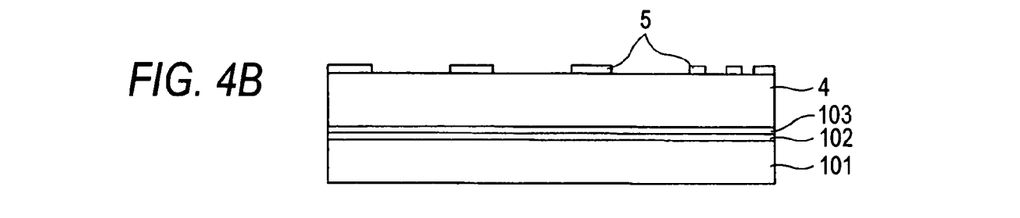
Figure 4C:
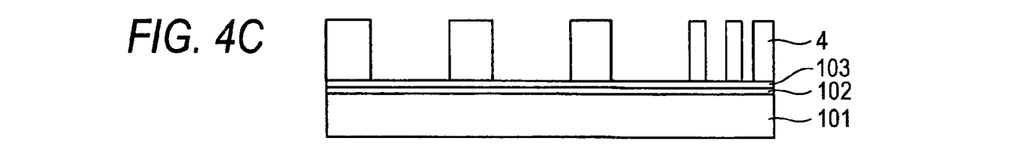

As shown in FIG. 4B, a photomask 5 having a prescribed pattern is provided on the resist film 4. As shown in FIG. 4C, the resist film 4 is exposed through openings of the photo mask 5 with an exposing means, which is not shown in the figures. According to the operation, a resist pattern having a reversal pattern of a cross sectional pattern of a target structure is formed.

Figure 4D:
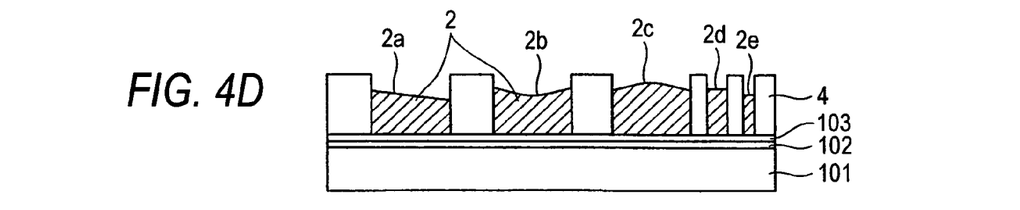

The metallic substrate 1 in the state shown in FIG. 4C is immersed in a plating bath, whereby a first electroformed film 2 of nickel as the first electroconductive film is grown to a thickness, for example, of 25 μm as shown in FIG. 4D. At this time, the thickness of the electroformed film 2 is fluctuated in some cases from about 24 to 26 μm depending on the location and shape of the cross sectional pattern. For example, as shown in FIG. 4D, such surfaces appear as an electroformed surface 2a being slanted, an electroformed surface 2b having a recession by increasing the thickness near the resist film 4, an electroformed surface 2c having a domy shape, and electroformed surfaces 2d and 2e having fluctuation in thickness caused by fluctuation in density of distances in the resist film 4. A nickel alloy, copper and a copper alloy may also be used as the first electroformed film 2 instead of nickel.

Figure 4E:
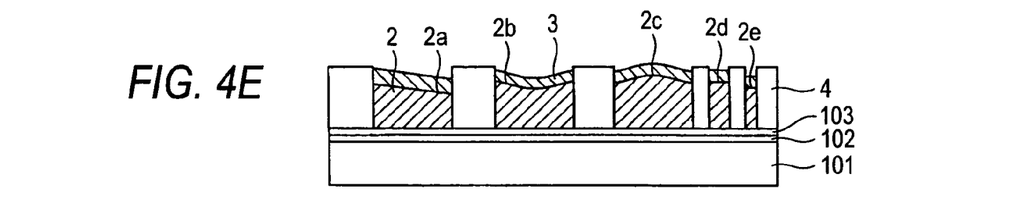

As shown in FIG. 4E, a second electroformed film 3 of gold as the second electroconductive film is grown by a vacuum deposition method, such as sputtering and resistance heating vapor deposition, as similar to the first embodiment.

Figure 4F:
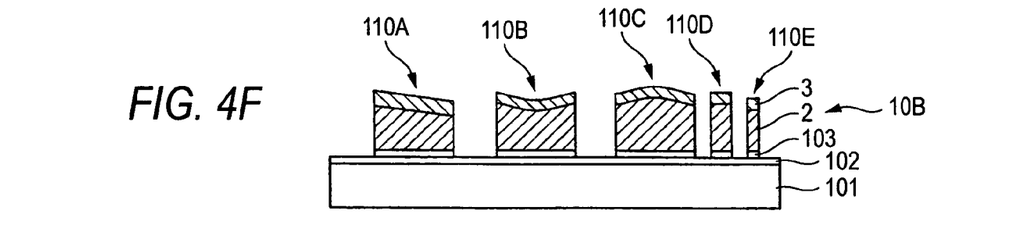

The resist film 4 is removed with a remover solution, and the electroconductive layer 103 is etched with the first and second electroformed films 2 and 3 used as a mask. According to the operation, a donor substrate 10B having plural electroconductive film patterns 110A to 110E each containing the first electroformed film 2, the second electroformed film 3 and the electroconductive layer 103 as shown in FIG. 4F.

(2) Transfer of Electroconductive Film Pattern

The five electroconductive film patterns 110A to 110E on the donor substrate 10B are sequentially transferred and laminated onto a surface of a target substrate 20 in the similar manner as in the first embodiment to fabricate an electroformed laminated structure.

Figure 5:
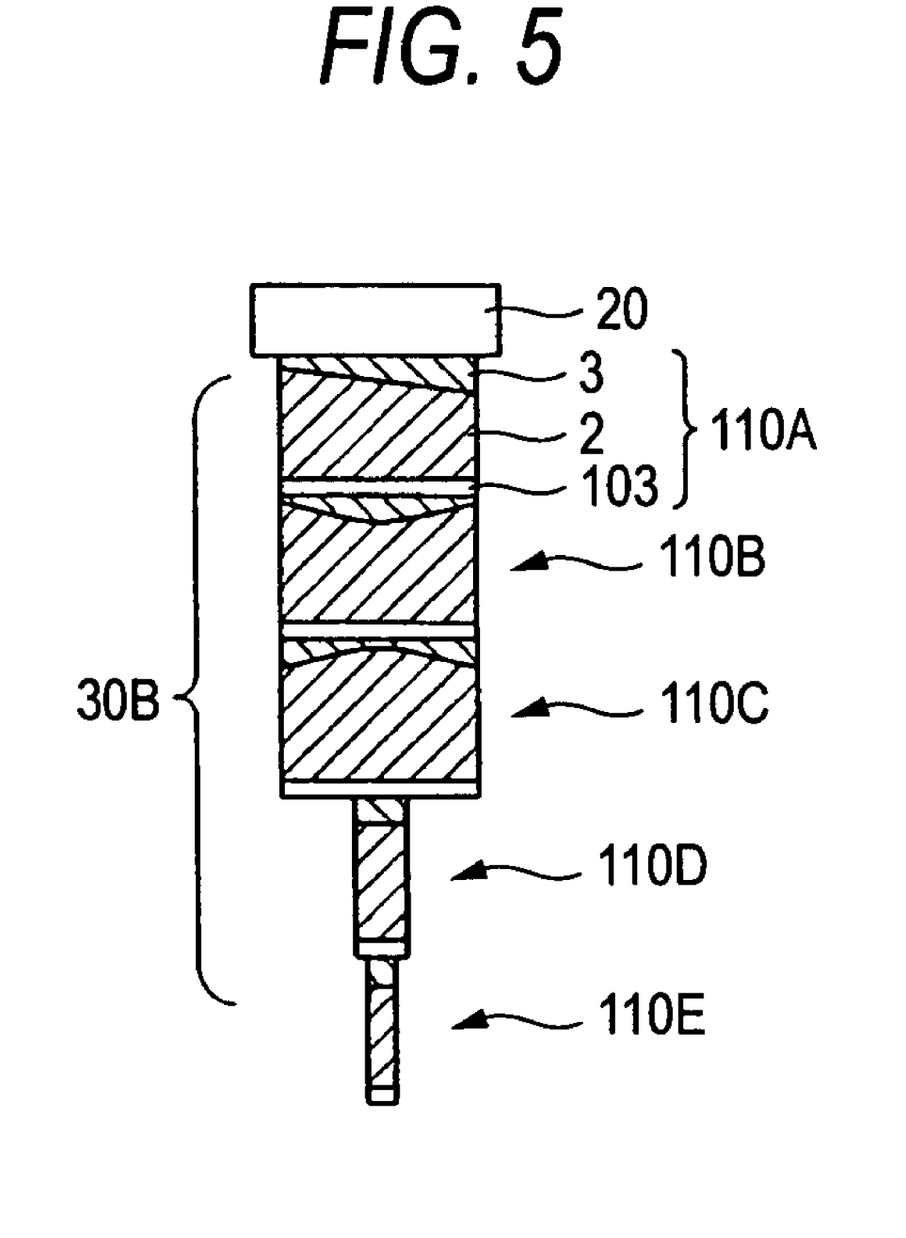
FIG. 5 is a cross sectional view of the electroformed laminated structure according to the second embodiment.

FIG. 5 is a cross sectional view of the electroformed laminated structure formed on the target substrate 20. Thereafter, the electroformed laminated structure 30B thus transferred onto the target substrate 20 is removed from the upper stage, and the target substrate 20 is removed therefrom to obtain the electroformed laminated structure 30B.

Advantage of Second Embodiment

According to the second embodiment, the electroconductive film pattern 11 has a three-layer structure containing the first electroformed film 2 of nickel having a high hardness, which mainly forms the structure, the second electroformed film 3 of gold having a hardness lower than the first electroformed film 2, and the electroconductive layer 103, whereby a laminated structure can be fabricated with good accuracy and good yield even in the case where the first electroformed film 2 is fluctuated in thickness.

Other Embodiments

The invention is not limited to the aforementioned embodiments, and various modified embodiments are possible unless the substance of the invention is deviated or changed.

As described above, the first aspect of the invention provides a laminated structure containing a first electroconductive film having a prescribed hardness and a second electroconductive film having a hardness that is lower than the prescribed hardness, the first and second electroconductive films being laminated alternately.

According to the first aspect of the invention, even in the case where fluctuation occurs in thickness of the first electroconductive film, the second electroconductive film formed on the first electroconductive film flattens the surface of the electroconductive film pattern formed of the first and second electroconductive films, whereby the thickness of the electroconductive film pattern is uniformized to obtain a good thickness profile.

It is possible that the first electroconductive film has a thickness that is larger than that of the second electroconductive film. According to the constitution, the laminated structure can be constituted mainly by the first electroconductive film having a larger hardness to provide such a laminated structure that is totally undeformable.

It is preferred that the second electroconductive film has a thickness that is larger than a difference between a maximum value and a minimum value of a thickness of the first electroconductive film. According to the constitution, upon plastic deformation of the second electroconductive film, the surface of the electroconductive film pattern is flattened to uniformize the thickness of the electroconductive film pattern.

It is preferred that the first electroconductive film has a surface roughness of 20 nm in terms of Ra. According to the constitution, the first electroconductive film and the second electroconductive film are firmly adhered.

It is possible that the first electroconductive film contains nickel, a nickel alloy, copper or a copper alloy, and the second electroconductive film contains gold.

It is also possible that the first and second electroconductive films adjacent to each other form one electroconductive film pattern, and the laminated structure further contains a third electroconductive film between the electroconductive film patterns.

The second aspect of the invention provides a donor substrate including a substrate, plural first electroconductive films each having a prescribed hardness formed on the substrate, and plural second electroconductive films each having a hardness that is lower than the prescribed hardness formed on the plural first electroconductive films.

According to the second aspect of the invention, even in the case where fluctuation occurs in thickness of the first electroconductive film, the second electroconductive film formed on the first electroconductive film flattens the surface of the electroconductive film pattern formed of the first and second electroconductive films, whereby the thickness of the electroconductive film pattern is uniformized to obtain a good thickness profile.

It is possible that the substrate contains a metal. By using a substrate containing a metal, the first and second electroconductive films can be produced by electroforming.

It is preferred that the substrate has a surface roughness of 10 nm or less in terms of Ra. A releasing layer may be omitted by using a substrate having a surface roughness of 10 nm or less in terms of Ra.

It is also possible that the substrate contains a non-metallic material, and the donor substrate further contains a third electroconductive film between the first electroconductive film and the substrate.

The third aspect of the invention provides a process for producing a laminated structure comprising a first step of preparing a first substrate having electroconductivity, a second step of forming a first electroconductive film having a prescribed hardness on the first substrate by an electroforming method, and forming a second electroconductive film having a hardness that is lower than the prescribed hardness on the first electroconductive film by an electroforming method, a third step of patterning the first and second electroconductive films to a prescribed pattern to form plural electroconductive film patterns, and a fourth step of subjecting the first substrate and a second substrate repeatedly to pressure contact and release to transfer sequentially the plurality of electroconductive film patterns on the first substrate onto the second substrate.

According to the third aspect of the invention, in the case where a resist film having a pattern that is complemented to the shape of the first electroconductive film is formed on the first substrate, and then the first electroconductive film is formed in the space of the resist film, the surface of the first electroconductive film may be slanted, formed with a recession or a domy shape, and fluctuated in thickness due to fluctuation in density of distances in the resist pattern, but the second electroconductive film liable to undergo plastic deformation is formed on the surface of the first electroconductive film, and they are contacted under pressure in the fourth step, whereby the electroconductive film pattern can be uniformized in thickness.

It is possible that in the first step of preparing the first substrate, a metallic substrate is used as the first substrate. According to the constitution, the first and second electroconductive film can be produced by electroforming directly onto the metallic substrate.

It is possible that the first step of preparing the first substrate contains a step of polishing the metallic substrate. In this case, it is preferred that the polishing step provides the metallic substrate having a surface roughness of 10 nm or less in terms of Ra. By reducing the surface roughness of the metallic substrate, the electroconductive film pattern can be transferred from the first substrate to the second substrate without a releasing layer on the metallic substrate.

It is possible that in the fourth step of subjecting the first substrate and a second substrate repeatedly to pressure contact and release, a stress formed in the electroconductive film pattern upon pressure contact of the first and second substrates is equal to or larger than a yield stress of the second electroconductive film and is equal to or less than a yield stress of the first electroconductive film. According to the constitution, the second electroconductive undergoes plastic deformation upon contacting the first substrate and the second substrate under pressure to uniformize the thickness of the electroconductive film pattern.

It is possible that in the first step of preparing the metallic substrate, a non-metallic substrate having a third electroconductive film formed thereon is used as the first substrate. According to the constitution, the first and second electroconductive films can be formed by electroforming owing to the third electroconductive film formed on the non-metallic substrate.

The entire disclosure of Japanese Patent Application No. 2005-169529 filed on Jun. 9, 2005 including specification, claims, drawings and abstract is incorporated herein by reference in its entirety.

What is claimed is:

1. A laminated structure comprising:
a plurality of first electroconductive films each having a prescribed hardness; and
a plurality of second electroconductive films each having a hardness that is lower than the prescribed hardness;
wherein one of the plurality of first electroconductive films is positioned at the bottom of the laminated structure,
one of the plurality of second electroconductive films is positioned at the top of the laminated structure,
the plurality of first electroconductive films are all made from the same material,
the plurality of second electroconductive films are all made from the same material, and
the first and second electroconductive films are laminated alternately.

2. The laminated structure as claimed in claim 1, wherein each of the first electroconductive films has a thickness that is larger than that of each of the second electroconductive films.

3. The laminated structure as claimed in claim 1, wherein each of the second electroconductive films has a thickness that is larger than a difference between a maximum value and a minimum value of a thickness of each of the first electroconductive films.

4. The laminated structure as claimed in claim 1,
wherein the first electroconductive film has a surface roughness of 20 nm in terms of Ra.

5. The laminated structure as claimed in claim 1, wherein the plurality of first electroconductive film comprise nickel, a nickel alloy, copper or a copper alloy; and
the second electroconductive film comprises gold.

6. The laminated structure as claimed in claim 1, wherein the plurality of first electroconductive films and the plurality of second electroconductive films form a plurality of electroconductive film patterns each including one of the plurality of first electroconductive films and one of the plurality of second electroconductive films which are disposed adjacently to each other; and the laminated structure further comprises a third electroconductive film between the electroconductive film patterns.

7. A donor substrate comprising:

a substrate;

a plurality of first electroconductive films each having a prescribed hardness, formed on the substrate; and a plurality of second electroconductive films each having a hardness that is lower than the prescribed hardness, formed on the plurality of first electroconductive films respectively, wherein the plurality of first electroconductive films are all made from the same material, and the plurality of second electroconductive films are all made from the same material.

8. The donor substrate as claimed in claim 7, wherein the substrate comprises a metal.

9. The donor substrate as claimed in claim 8, wherein the substrate has a surface roughness of 10 nm or less in terms of Ra.

10. The donor substrate as claimed in claim 7, wherein the substrate comprises a non-metallic material; and the donor substrate further comprises a third electroconductive film between one of the plurality of first electroconductive film and the substrate.

11. The donor substrate as claimed in claim 7, wherein the first electroconductive film has a surface roughness of 20 nm in terms of Ra.

* * * * *